(12) United States Patent
Kim

(10) Patent No.: US 9,747,970 B2
(45) Date of Patent: Aug. 29, 2017

(54) REFRESH CIRCUIT

(71) Applicant: SK hynix Inc., Icheon-si, Gyeonggi-do (KR)

(72) Inventor: Hong Jung Kim, Icheon-si (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 213 days.

(21) Appl. No.: 14/539,762

(22) Filed: Nov. 12, 2014

(65) Prior Publication Data

US 2016/0027491 A1 Jan. 28, 2016

(30) Foreign Application Priority Data

Jul. 28, 2014 (KR) .................. 10-2014-0095632

(51) Int. Cl.
*G11C 7/22* (2006.01)
*G11C 11/406* (2006.01)

(52) U.S. Cl.
CPC .. *G11C 11/40618* (2013.01); *G11C 11/40622* (2013.01)

(58) Field of Classification Search
CPC .............................................. G11C 11/40618
USPC ......................................................... 365/222
See application file for complete search history.

(56) References Cited

U.S. PATENT DOCUMENTS

| | | | | |
|---|---|---|---|---|
| 4,887,240 A * | 12/1989 | Garverick | ............ | G11C 11/406 365/189.04 |
| 5,654,929 A * | 8/1997 | Mote, Jr. | ............... | G11C 11/408 365/149 |
| 5,959,923 A * | 9/1999 | Matteson | ............ | G11C 11/406 365/222 |
| 6,078,543 A * | 6/2000 | Kim | ...................... | G11C 11/406 365/222 |
| 6,166,972 A * | 12/2000 | Hidaka | ................. | G11C 11/406 365/200 |
| 6,515,929 B1* | 2/2003 | Ting | ....................... | G11C 11/406 365/189.011 |
| 2003/0112689 A1* | 6/2003 | Natsui | .................. | G11C 11/406 365/222 |
| 2006/0104139 A1* | 5/2006 | Hur | ....................... | G11C 11/406 365/222 |
| 2006/0250873 A1* | 11/2006 | Hosokawa | ........... | G11C 11/406 365/222 |
| 2007/0076504 A1* | 4/2007 | Suh | ....................... | G11C 11/406 365/222 |

(Continued)

FOREIGN PATENT DOCUMENTS

KR    1020020042030 A    6/2002

*Primary Examiner* — Hoai V Ho
*Assistant Examiner* — Jay Radke
(74) *Attorney, Agent, or Firm* — William Park & Associates Ltd.

(57) ABSTRACT

A refresh circuit is configured to perform a first refresh operation for a plurality of memory banks. The first refresh operation may be performed within a first time period determined according to a first parameter. The refresh circuit may be configured to perform a second refresh operation for a partial number of memory banks among the plurality of memory banks. The second refresh operation may be performed for the partial number of memory banks that have completed the first refresh operation. The second refresh operation may be performed within the first time period.

18 Claims, 8 Drawing Sheets

(56) References Cited

U.S. PATENT DOCUMENTS

2009/0021999 A1* 1/2009 Tanimura .............. G11C 7/222
    365/200
2012/0079183 A1* 3/2012 Bains ............... G11C 11/40615
    711/106

* cited by examiner

REFRESH CIRCUIT

CROSS-REFERENCES TO RELATED APPLICATION

The present application claims priority under 35 U.S.C. §119(a) to Korean application number 10-2014-0095632, filed on Jul. 28, 2014, in the Korean Intellectual Property Office, which is incorporated herein by reference in its entirety.

BACKGROUND

1. Technical Field

Various embodiments generally relate to a semiconductor apparatus, and more particularly, to a refresh circuit.

2. Related Art

In a semiconductor apparatus, in particular, a volatile semiconductor apparatus, a refresh operation for retaining the data values stored in memory cells is essential, attributable to the characteristic thereof.

A semiconductor apparatus may include a plurality of memory blocks, for example, a plurality of memory banks.

Accordingly, in order to improve the performance of the semiconductor apparatus, it may be important to efficiently refresh the plurality of memory banks.

SUMMARY

In an embodiment, a refresh circuit may be configured to perform a first refresh operation for a plurality of memory banks. The first refresh operation may be performed within a first time period determined according to a first parameter. The refresh circuit may be configured to perform a second refresh operation for a partial number of memory banks among the plurality of memory banks. The second refresh operation may be performed for the partial number of memory banks that have completed the first refresh operation. The second refresh operation may be performed within the first time period.

In an embodiment, a refresh circuit may be configured to perform, while performing a first refresh operation for a plurality of memory banks within a first time period determined according to a first parameter in response to an initial refresh command, a second refresh operation for a first memory bank group for which the first refresh operation is completed, within the first time period, and perform, while performing the first refresh operation for the plurality of memory banks, starting from a memory bank ordered next to the first memory bank group, within the first time in response to a refresh command after the initial refresh command, the second refresh operation for a second memory bank group for which the first refresh operation is completed, within the first time period.

In an embodiment, a refresh circuit may include a memory region configured to perform a first refresh operation for a plurality of memory banks and a second refresh operation for a partial number of memory banks among the plurality of memory banks. The first and second refresh operations may be performed in response to row active signals and additional refresh flags. The refresh circuit may include a control block configured to generate pre-control signals and the additional refresh flags for controlling the first refresh operation and the second refresh operation, in response to a refresh command. The refresh circuit may include a counting block configured to generate bank count signals in response to the refresh command. The refresh circuit may also include a switching block configured to generate control signals for changing an order of memory banks designated by the pre-control signals among the plurality of memory banks, in response to the bank count signals, and an active signal generation block configured to generate the row active signals. The row active signals define active periods of memory banks corresponding to the control signals among the plurality of memory banks.

In an embodiment, a refresh circuit may be configured to perform a first refresh operation for a plurality of memory banks within a first time period, and may be configured to perform a second refresh operation for a partial number of memory banks among the plurality of memory banks. The second refresh operation may be performed for the partial number of memory banks that have completed the first refresh operation.

DETAILED DESCRIPTION

Figure 1:
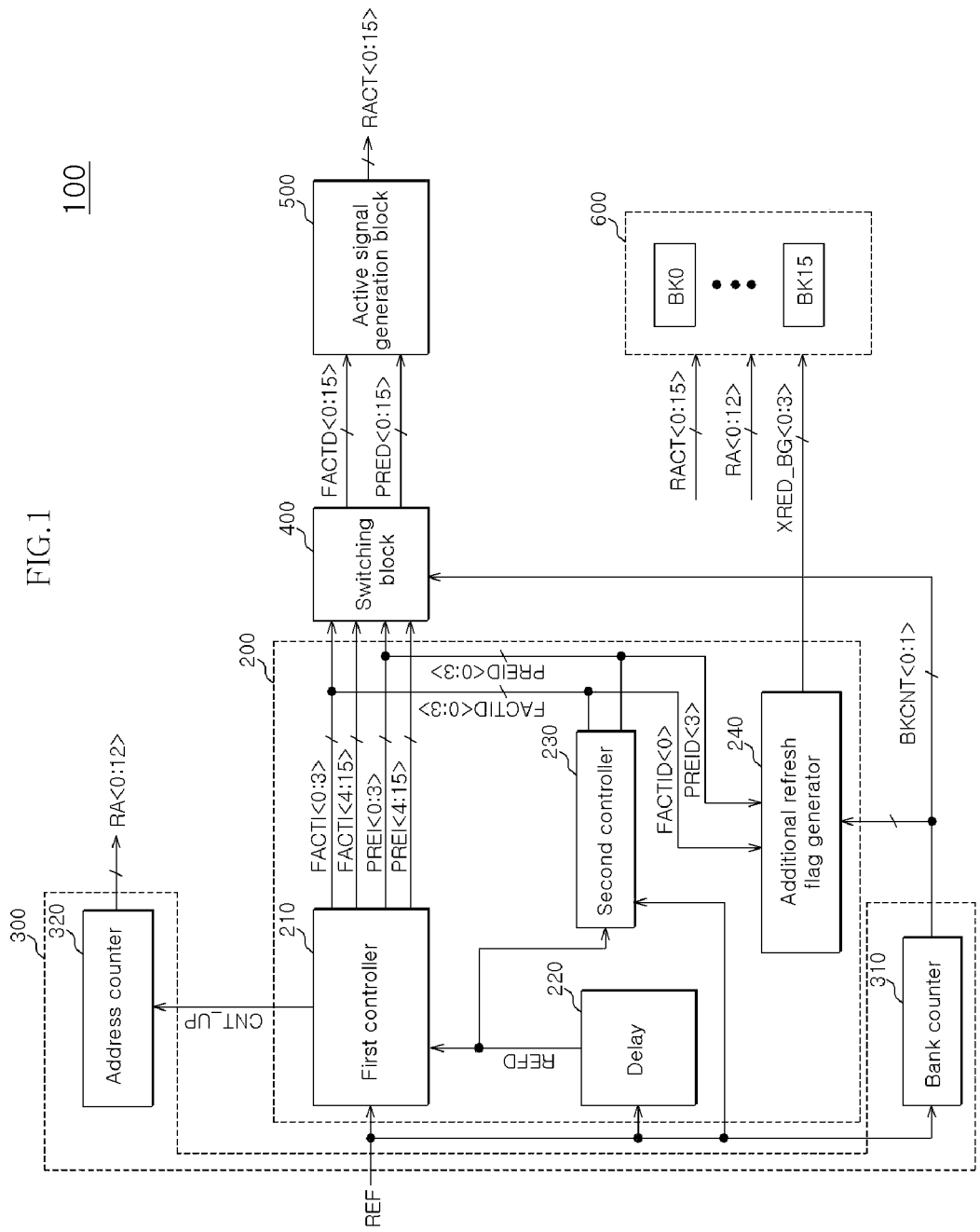
FIG. 1 is a configuration diagram illustrating a representation of an example of a refresh circuit in accordance with an embodiment.

Hereinafter, a refresh circuit will be described below with reference to the accompanying drawings through various examples of embodiments.

A semiconductor apparatus in accordance with an embodiment may include a plurality of memory banks.

When performing a refresh operation for the plurality of memory banks, in order to efficiently perform the refresh operation for the plurality of memory banks, a piled (staggered) refresh scheme in which the plurality of memory banks are refreshed with time differences may be adopted.

First to fourth parameters related to an operation of the semiconductor apparatus, in particular, a refresh operation, include tRFC, tRC, tRAS and tRP.

tRFC is a parameter that defines a time period during which a refresh operation for all of the plurality of memory banks should be performed.

tRC equals tRAS+tRP.

tRAS is a parameter that defines a time period from the application time of an active command, that is, each of pre-control signals FACTI<0:15>, to a precharge start time.

tRP is a parameter that defines a time period from a precharge operation time to the application time of the next active command.

The refresh operation for the plurality of memory banks, according to one refresh command, may be performed within tRFC.

In an embodiment, while a first refresh operation, that is, a normal refresh operation, is performed within tRFC according to a refresh command, a second refresh operation, that is, an additional refresh operation, is performed for a partial number of memory banks, by using a marginal time period.

In an embodiment, while the normal refresh operation is performed for the plurality of banks within tRFC according to an initial refresh command, in the examples where a marginal time period after the refresh operation for a first memory bank group, that is, partial precedently ordered memory banks, is completed is equal to or longer than tRC, the additional refresh operation for the first memory bank group may be performed.

That is to say, in the examples where a plurality of tRC are included in the marginal time period, the refresh operation may be performed a multitude of times for a partial number of memory banks.

The number of memory banks for which the additional refresh operation is possible may be changed according to tRFC, a piled delay, the number of total memory banks, and tRC.

The normal refresh operation and the additional refresh operation may be performed in a piled refresh scheme.

In an embodiment, while the normal refresh operation is performed for the plurality of memory banks, starting from a memory bank ordered next to the first memory bank group, within tRFC in response to a refresh command after the initial refresh command, in the example where a marginal time period after the refresh operation for a second memory bank group, that is, partial precedently ordered memory banks, is completed is equal to or longer than tRC, the additional refresh operation for the second memory bank group may be performed.

Various embodiments may be directed to a refresh circuit capable of performing an efficient refresh.

Referring to FIG. 1, a refresh circuit 100 in accordance with an embodiment may include a control block 200, a counting block 300, and a switching block 400. The refresh circuit may also include an active signal generation block 500 and a memory region 600.

The memory region 600 may include a plurality of unit memory blocks, that is, a plurality of memory banks BK0 to BK15, and a data processing circuit (not shown).

The plurality of memory banks BK0 to BK15 represents an example in which 16 memory banks are provided. However the embodiments are not limited to only 16 memory banks and may include more or less than 16 memory banks.

The memory region 600 may be configured to perform a refresh operation for the plurality of memory banks BK0 to BK15. The memory region 600 may perform a refresh operation for the plurality of memory banks BK0 to BK15, in response to row active signals RACT<0:15>, row address signals RA<0:12>, and additional refresh flags XRED_BG<0:3>.

The row active signals RACT<0:15> may selectively designate the active operations of the plurality of memory banks BK0 to BK15.

The row address signals RA<0:12> may select one of normal word lines of any one memory bank among the plurality of memory banks BK0 to BK15 active-designated by the row active signals RACT<0:15>.

The additional refresh flags XRED_BG<0:3> may define additional refresh periods for predefined memory bank groups.

The respective additional refresh flags XRED_BG<0:3> may define additional refresh periods for respective memory bank groups BK0 to BK3, BK4 to BK7, BK8 to BK11 and BK12 to BK15.

For example, while an additional refresh operation is performed for the memory banks BK0 to BK3, a normal refresh operation for a partial number of memory banks, for example, the memory banks BK12 to BK15, is not completed yet.

Therefore, by allocating the additional refresh flags XRED_BG<0:3> to the respective memory bank groups BK0 to BK3, BK4 to BK7, BK8 to BK11 and BK12 to BK15 and sequentially activating the additional refresh flags XRED_BG<0:3>, memory banks for which the additional refresh operation is to be performed may be precisely distinguished.

The memory region 600 may be configured to perform the normal refresh operation for the normal regions of memory banks corresponding to the row active signals RACT<0:15> and the row address signals RA<0:12>. The memory region 600 may perform the normal refresh operation for the normal regions of memory banks corresponding to the row active signals RACT<0:15> and the row address signals RA<0:12>, during the deactivation periods of the additional refresh flags XRED_BG<0:3>.

The memory region 600 may be configured to perform the additional refresh operation for the redundant regions of memory banks corresponding to the additional refresh flags XRED_BG<0:3>. The memory region 600 may perform the additional refresh operation for the redundant regions of memory banks corresponding to the additional refresh flags XRED_BG<0:3>, during the activation periods of the additional refresh flags XRED_BG<0:3>.

The control block 200 may be configured to generate pre-control signals FACTI<0:15> and PREI<0:15> and the additional refresh flags XRED_BG<0:3>, for control of the normal refresh operation for the plurality of memory banks BK0 to BK15 and the additional refresh operation for a partial number of memory banks among the plurality of memory banks BK0 to BK15. The control block 200 may generate pre-control signals FACTI<0:15> and PREI<0:15> and the additional refresh flags XRED_BG<0:3>, for control of the normal refresh operation for the plurality of memory banks BK0 to BK15 and the additional refresh operation for a partial number of memory banks among the plurality of memory banks BK0 to BK15, in response to a refresh command REF.

An embodiment may represent an example in which 16 memory banks are provided. Since a marginal time period after the normal refresh operation for the precedently ordered 4 memory banks BK0 to BK3 is completed is equal to or longer than tRC within tRFC, the additional refresh operation for the 4 memory banks BK0 to BK3 may be performed for the corresponding time period.

The normal refresh operation may be performed by activating normal word lines that are electrically coupled with the normal memory cells of the memory banks BK0 to BK15. The additional refresh operation may be performed by activating redundant word lines that are electrically coupled with the redundant memory cells of the memory banks BK0 to BK3.

The control block 200 may include a first controller 210, a delay 220, a second controller 230, and an additional refresh flag generator 240.

The first controller 210 may be configured to generate the pre-control signals FACTI<0:15> and PREI<0:15> for the normal refresh operation for the plurality of memory banks BK0 to BK15. The first controller 210 may generate the pre-control signals FACTI<0:15> and PREI<0:15> for the normal refresh operation for the plurality of memory banks BK0 to BK15, in response to the refresh command REF.

The first controller 210 may be configured to deactivate partial signal bits FACTI<0:3> and PREI<0:3> among the pre-control signals FACTI<0:15> and PREI<0:15>. The first controller 210 may deactivate partial signal bits FACTI<0:

3> and PREI<0:3> among the pre-control signals FACTI<0: 15> and PREI<0:15>, in response to a delayed refresh command REFD.

The deactivation of the partial signal bits FACTI<0:3> and PREI<0:3> may be implemented by floating signal lines for transmitting the partial signal bits FACTI<0:3> and PREI<0:3>.

Among the pre-control signals FACTI<0:15> and PREI<0:15>, the pre-control signals FACTI<0:15> may be signals for designating active timing of the word lines of corresponding memory banks, and the pre-control signals PREI<0:15> may be signals for designating precharge timing of the word lines of corresponding memory banks.

For example, the pre-control signals FACTI<0> may be a signal for designating active timing of a specified word line of the memory bank BK0. For example, the pre-control signal PREI<0> may be a signal for designating precharge timing of a specified word line of the memory bank BK0.

The first controller 210 may be configured to generate a count-up signal CNT_UP. The first controller 210 may generate a count-up signal CNT_UP in response to the refresh command REF.

The first controller 210 may be configured to generate the count-up signal CNT_UP. The first controller 210 may generate the count-up signal CNT_UP each time the refresh command REF is inputted.

The delay 220 may be configured to delay the refresh command REF by a predetermined delay time, and output the delayed refresh command REFD.

The delay 220 may be designed to have a delay time corresponding to tRC.

The second controller 230 may be configured to generate additional pre-control signals FACTID<0:3> and PREID<0: 3> for the additional refresh operation for a partial number of memory banks among the plurality of memory banks BK0 to BK15. The second controller 230 may generate additional pre-control signals FACTID<0:3> and PREID<0: 3> for the additional refresh operation for a partial number of memory banks among the plurality of memory banks BK0 to BK15, in response to the delayed refresh command REFD.

The second controller 230 may be configured to deactivate/activate the additional pre-control signals FACTID<0: 3> and PREID<0:3>. The second controller 230 may deactivate/activate the additional pre-control signals FACTID<0: 3> and PREID<0:3> in response to the refresh command REF.

The deactivation of the additional pre-control signals FACTID<0:3> and PREID<0:3> may be implemented by floating signal lines for transmitting the additional pre-control signals FACTID<0:3> and PREID<0:3>.

The signal lines for transmitting the additional pre-control signals FACTID<0:3> and PREID<0:3> may be respectively shorted with the signal lines for transmitting the pre-control signals FACTI<0:3> and PREI<0:3>.

The signal lines for transmitting the additional pre-control signals FACTID<0:3> may be respectively shorted with the signal lines for transmitting the pre-control signals FACTI<0:3>.

The signal lines for transmitting the additional pre-control signals PREID<0:3> may be respectively shorted with the signal lines for transmitting the pre-control signals PREI<0: 3>.

By the above-described operations of the first controller 210 and the second controller 230 illustrated in FIG. 1, the additional pre-control signals FACTID<0:3> are floated (deactivated) while the pre-control signals FACTI<0:3> are inputted (activated), and the pre-control signals FACTI<0: 3> are floated (deactivated) while the additional pre-control signals FACTID<0:3> are inputted (activated).

The pre-control signals FACTk0:3> and the additional pre-control signals FACTID<0:3> are inputted through the same signal lines except that they are activated at different times.

Thus, the additional pre-control signals FACTID<0:3> and PREID<0:3> may be used substantially in the same manner as that of the pre-control signals FACTI<0:3> and PREI<0:3>.

The additional refresh flag generator 240 may be configured to generate the additional refresh flags XRED_BG<0: 3>. The additional refresh flag generator 240 may generate the additional refresh flags XRED_BG<0:3> in response to bank count signals BKCNT<0:1> and a part of the additional pre-control signals FACTID<0:3> and PREID<0:3>, that is, the additional pre-control signals FACTID<0> and PREID<3>.

The additional refresh flag generator 240 may be configured to sequentially activate the additional refresh flags XRED_BG<0:3>. The additional refresh flag generator 240 may sequentially activate the additional refresh flags XRED_BG<0:3> in response to the bank count signals BKCNT<0:1>.

The activation timing and the deactivation timing of the respective additional refresh flags XRED_BG<0:3> may be determined by the additional pre-control signals FACTID<0> and PREID<3>.

The counting block 300 may be configured to generate the bank count signals BKCNT<0:1>. The counting block 300 may generate the bank count signals BKCNT<0:1> in response to the refresh command REF.

The counting block 300 may be configured to sequentially increase the bank count signals BKCNT<0:1>. The counting block 300 may sequentially increase the bank count signals BKCNT<0:1> in response to the refresh command REF.

The counting block 300 may be configured to generate the row address signals RA<0:12>. The counting block 300 may generate the row address signals RA<0:12> in response to the count-up signal CNT_UP.

The counting block 300 may be configured to sequentially increase the row address signals RA<0:12>. The counting block 300 may sequentially increase the row address signals RA<0:12> in response to the count-up signal CNT_UP.

The counting block 300 may include a bank counter 310. The counting block 300 may further include an address counter 320.

The bank counter 310 may be configured to sequentially increase the bank count signals BKCNT<0:1>. The bank counter 310 may sequentially increase the bank count signals BKCNT<0:1> in response to the refresh command REF.

The address counter 320 may be configured to sequentially increase the row address signals RA<0:12>. The address counter 320 may sequentially increase the row address signals RA<0:12> in response to the count-up signal CNT_UP.

The switching block 400 may be configured to generate control signals FACTD<0:15> and PRED<0:15> for changing active and precharge orders of memory banks based on the pre-control signals FACTI<0:15> and PREI<0:15> and the additional pre-control signals FACTID<0:3> and PREID<0:3>. In response to the bank count signals BKCNT<0:1>, the switching block 400 may generate control signals FACTD<0:15> and PRED<0:15> for changing active and precharge orders of memory banks based on the pre-control signals FACTI<0:15> and PREI<0:15> and the additional pre-control signals FACTID<0:3> and PREID<0:3>.

The active signal generation block 500 may be configured to generate the row active signals RACT<0:15>. The row active signals RACT<0:15> may define the active and precharge periods of the plurality of memory banks BK0 to BK15. The active signal generation block 500 may generate the row active signals RACT<0:15> in response to the control signals FACTD<0:15> and PRED<0:15>.

Figure 2A:
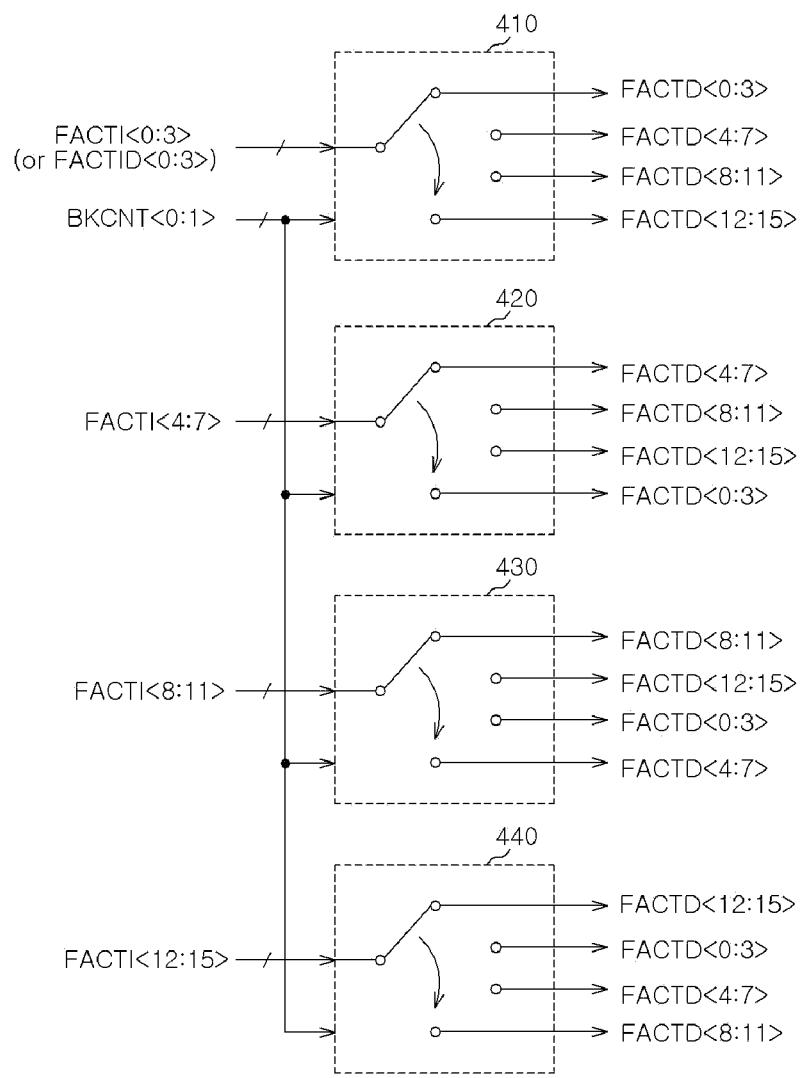
FIGS. 2A and 2B are circuit diagram representations of the switching block illustrated in FIG. 1.
Figure 2B:
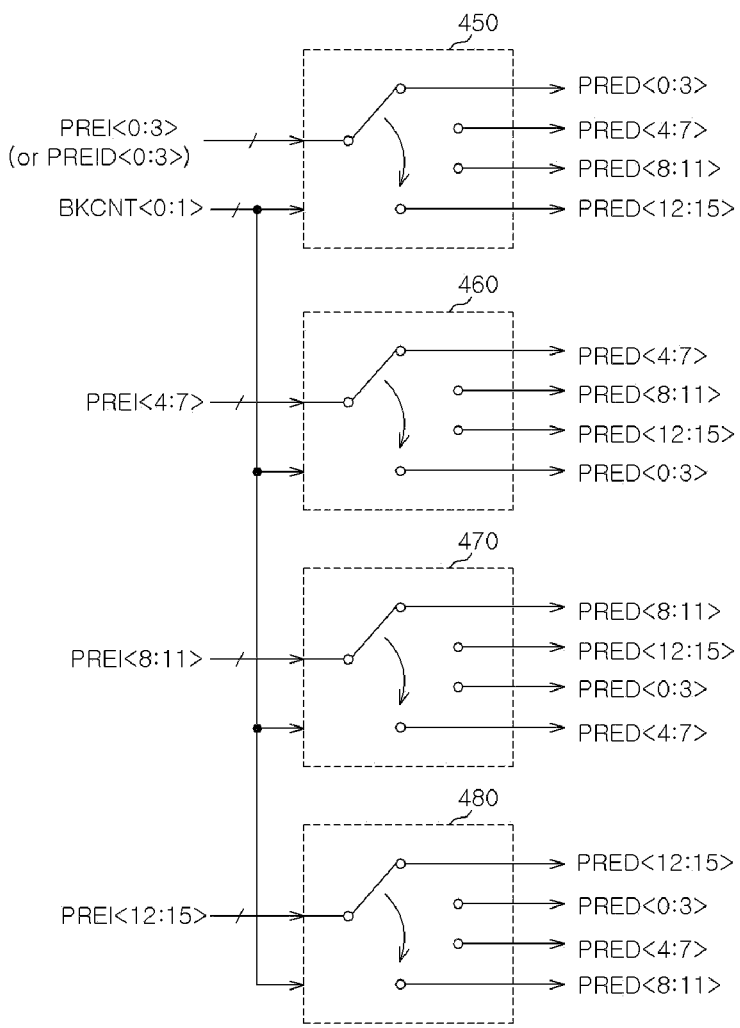

As illustrated in FIGS. 2A and 2B, the switching block 400 may include first to eighth switching units 410 to 480.

Referring to FIG. 2A, the first to fourth switching units 410 to 440 may be configured to be commonly inputted with the bank count signals BKCNT<0:1>, and be inputted with the pre-control signals FACTI<0:15> and the additional pre-control signals FACTID<0:3> by the unit of 4 bits.

The first to fourth switching units 410 to 440 may output the pre-control signals FACTI<0:15> and the additional pre-control signals FACTID<0:3>, as the control signals FACTD<0:15>, in response to the bank count signals BKCNT<0:1>.

The first to fourth switching units 410 to 440 may change the active order of the plurality of memory banks BK0 to BK15, by matching the pre-control signals FACTI<0:15> and the additional pre-control signals FACTID<0:3> to the control signals FACTD<0:15> of which order is sequentially changed in response to the bank count signals BKCNT<0:1>.

For example, the first switching unit 410 sequentially matches the pre-control signals FACTI<0:3> and the additional pre-control signals FACTID<0:3> to the control signals FACTD<0:3>, FACTD<4:7>, FACTD<8:11> and FACTD<12:15> as the value of the bank count signals BKCNT<0:1> is changed.

For example, the second switching unit 420 sequentially matches the pre-control signals FACTI<4:7> to the control signals FACTD<4:7>, FACTD<8:11>, FACTD<12:15> and FACTD<0:3> as the value of the bank count signals BKCNT<0:1> is changed.

For example, the third switching unit 430 sequentially matches the pre-control signals FACTI<8:11> to the control signals FACTD<8:11>, FACTD<12:15>, FACTD<0:3> and FACTD<4:7> as the value of the bank count signals BKCNT<0:1> is changed.

For example, the fourth switching unit 440 sequentially matches the pre-control signals FACTI<12:15> to the control signals FACTD<12:15>, FACTD<0:3>, FACTD<4:7> and FACTD<8:11> as the value of the bank count signals BKCNT<0:1> is changed.

Referring to FIG. 2B, the fifth to eighth switching units 450 to 480 may be configured to be commonly inputted with the bank count signals BKCNT<0:1>, and be inputted with the pre-control signals PREI<0:15> and the additional pre-control signals PREID<0:3> by the unit of 4 bits.

The fifth to eighth switching units 450 to 480 may output the pre-control signals PREI<0:15> and the additional pre-control signals PREID<0:3>, as the control signals PRED<0:15>, in response to the bank count signals BKCNT<0:1>.

The fifth to eighth switching units 450 to 480 may change the precharge order of the plurality of memory banks BK0 to BK15, by matching the pre-control signals PREI<0:15> and the additional pre-control signals PREID<0:3> to the control signals PRED<0:15> of which order is sequentially changed in response to the bank count signals BKCNT<0:1>.

For example, the fifth switching unit 450 sequentially matches the pre-control signals PREI<0:3> and the additional pre-control signals PREID<0:3> to the control signals PRED<0:3>, PRED<4:7>, PRED<8:11> and PRED<12:15> as the value of the bank count signals BKCNT<0:1> is changed.

For example, the sixth switching unit 460 sequentially matches the pre-control signals PREI<4:7> to the control signals PRED<4:7>, PRED<8:11>, PRED<12:15> and PRED<0:3> as the value of the bank count signals BKCNT<0:1> is changed.

For example, the seventh switching unit 470 sequentially matches the pre-control signals PREI<8:11> to the control signals PRED<8:11>, PRED<12:15>, PRED<0:3> and PRED<4:7> as the value of the bank count signals BKCNT<0:1> is changed.

For example, the eighth switching unit 480 sequentially matches the pre-control signals PREI<12:15> to the control signals PRED<12:15>, PRED<0:3>, PRED<4:7> and PRED<8:11> as the value of the bank count signals BKCNT<0:1> is changed.

Operations of the refresh circuit 100 in accordance with an embodiment will be described with reference to FIGS. 3A to 4B.

Figure 3A:
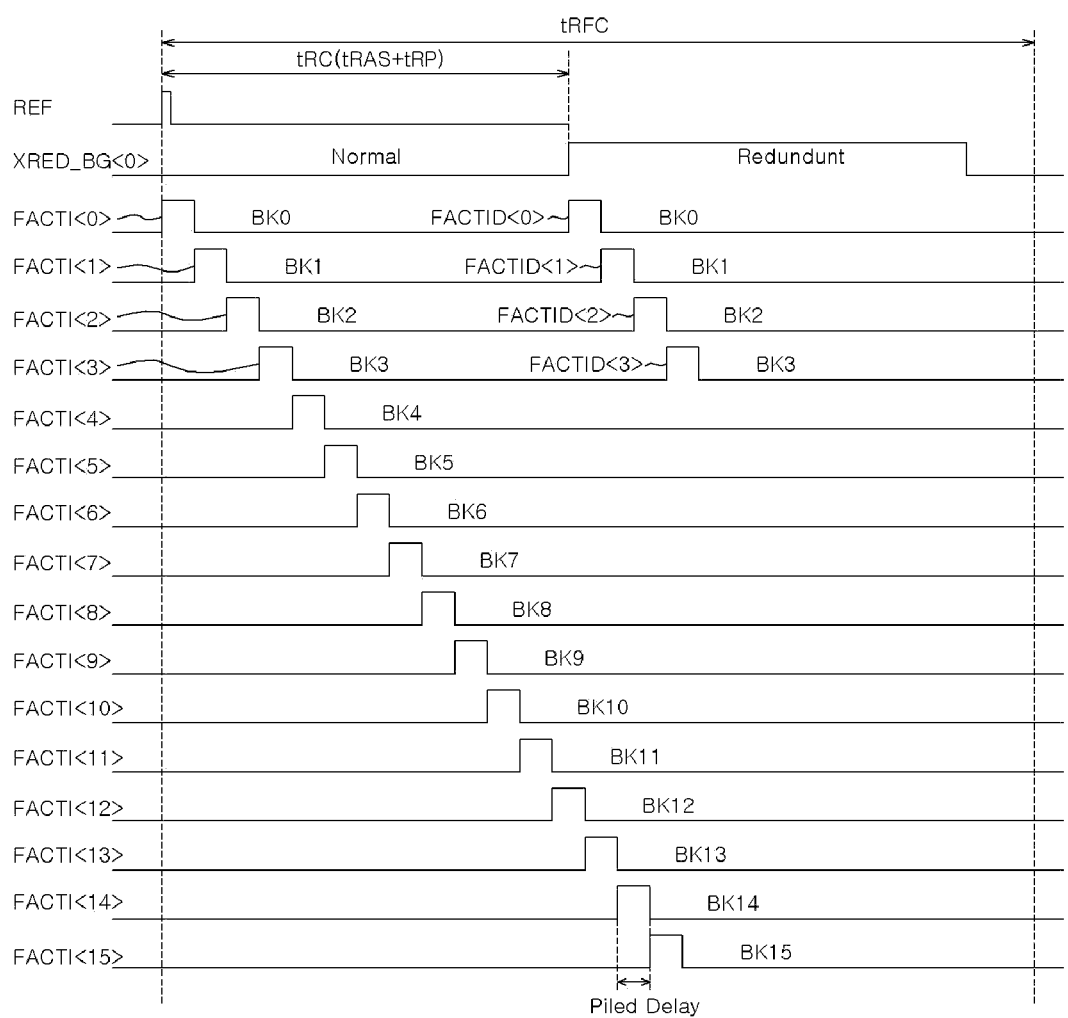
FIGS. 3A to 4B are refresh operation timing diagram representations with reference to FIG. 1.

As illustrated in FIG. 3A, as the refresh command REF is inputted, the pre-control signals FACTI<0:15> are sequentially activated with an interval of a piled delay.

After a delay time corresponding to tRC passes from when the refresh command REF is inputted, the additional pre-control signals FACTID<0:3> are sequentially activated with the interval of the piled delay.

Figure 3B:
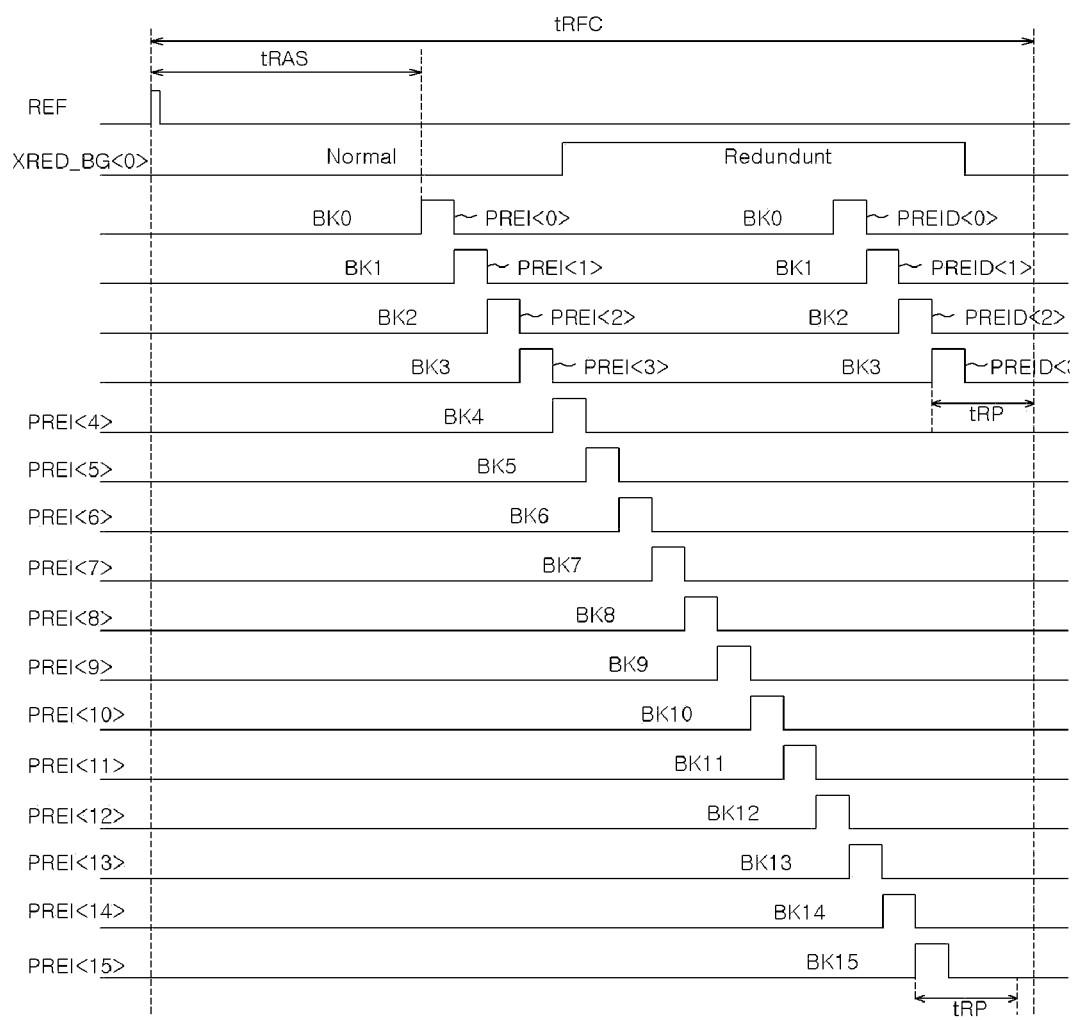

As illustrated in FIG. 3B, after a delay time corresponding to tRAS passes from the activation timing of the respective pre-control signals FACTI<0:15>, the pre-control signals PREI<0:15> are sequentially activated with the interval of the piled delay.

After the delay time corresponding to tRAS passes from the activation timing of the respective additional pre-control signals FACTID<0:3>, the additional pre-control signals PREID<0:3> are sequentially activated with the interval of the piled delay.

The control signals FACTD<0:15> and PRED<0:15> are generated by the pre-control signals FACTI<0:15> and PREI<0:15> and the additional pre-control signals FACTID<0:3> and PREID<0:3> which are generated in FIGS. 3A and 3B.

According to the control signals FACTD<0:15> and PRED<0:15>, the row active signals RACT<0:15> are generated.

While the additional refresh flag XRED_BG<0> among the additional refresh flags XRED_BG<0:3> retains a deactivated state (a logic low) by the bank count signals BKCNT<0:1> which are generated by the initial refresh command REF, the additional refresh flag XRED_BG<0> is activated by the additional pre-control signal FACTID<0> and is deactivated by the additional pre-control signal PREID<3>.

The remaining additional refresh flags XRED_BG<1:3> retain a deactivated state.

While the additional refresh flag XRED_BG<0> remains in the deactivated state (the logic low), the memory region 600 performs a normal piled refresh operation by activating normal word lines of the plurality of memory banks BK0 to BK15 in the order of the memory banks BK0, BK1, BK2, ... , BK14 and BK15 according to the row active signals RACT<0:15> and the row address signals RA<0:12>.

While the additional refresh flag XRED_BG<0> remains in an activated state (a logic high), the memory region 600 may determine that a redundant piled refresh operation for the memory banks BK0 to BK3 corresponding to the additional refresh flag XRED_BG<0> among the plurality of memory banks BK0 to BK15 is designated.

While remaining in the normal piled refresh operation for the memory banks BK0 to BK15, the memory region 600 performs the redundant piled refresh operation by activating redundant word lines of the memory banks BK0 to BK3 corresponding to the additional refresh flag XRED_BG<0> in the order of the memory banks BK0, BK1, BK2 and BK3.

Figure 4A:
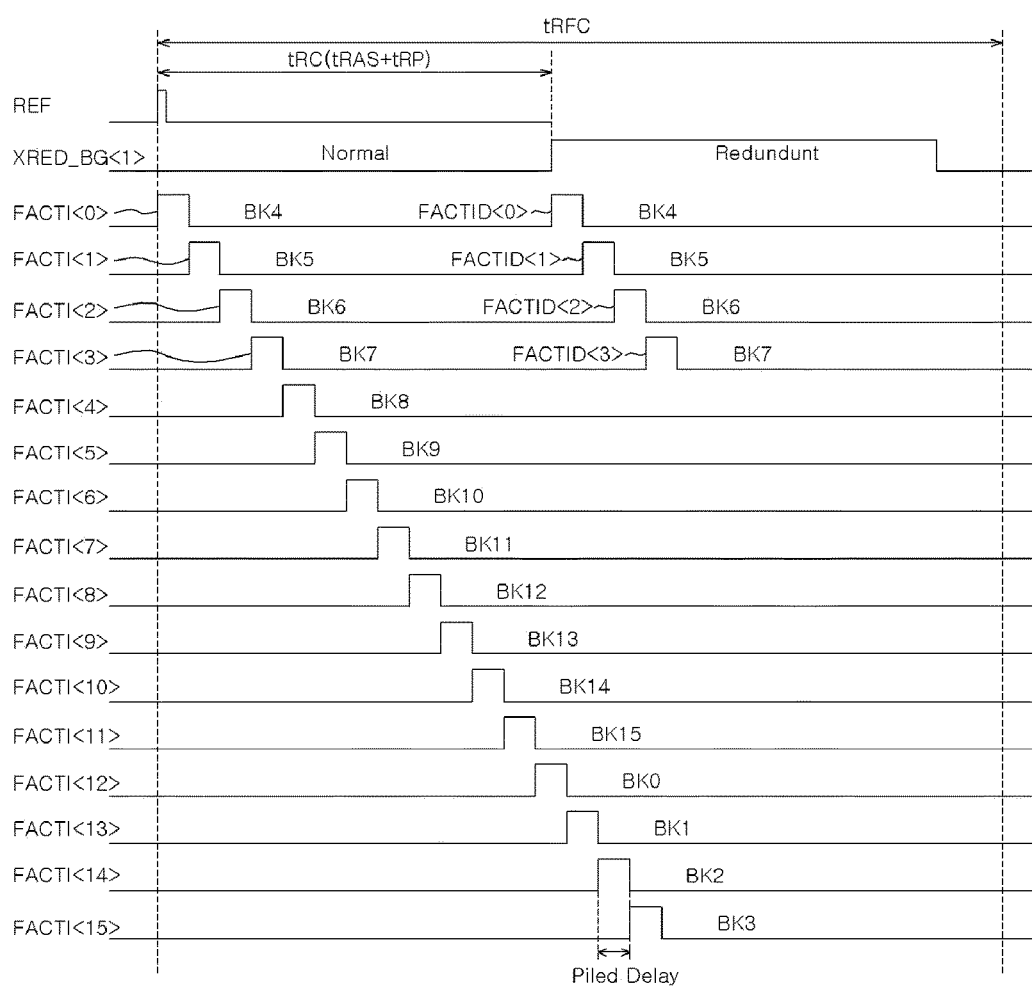

As illustrated in FIG. 4A, as the refresh command REF is inputted again, the pre-control signals FACTI<0:15> are sequentially activated with the interval of the piled delay.

After the delay time corresponding to tRC passes from when the refresh command REF is inputted, the additional pre-control signals FACTID<0:3> are sequentially activated with the interval of the piled delay.

Figure 4B:
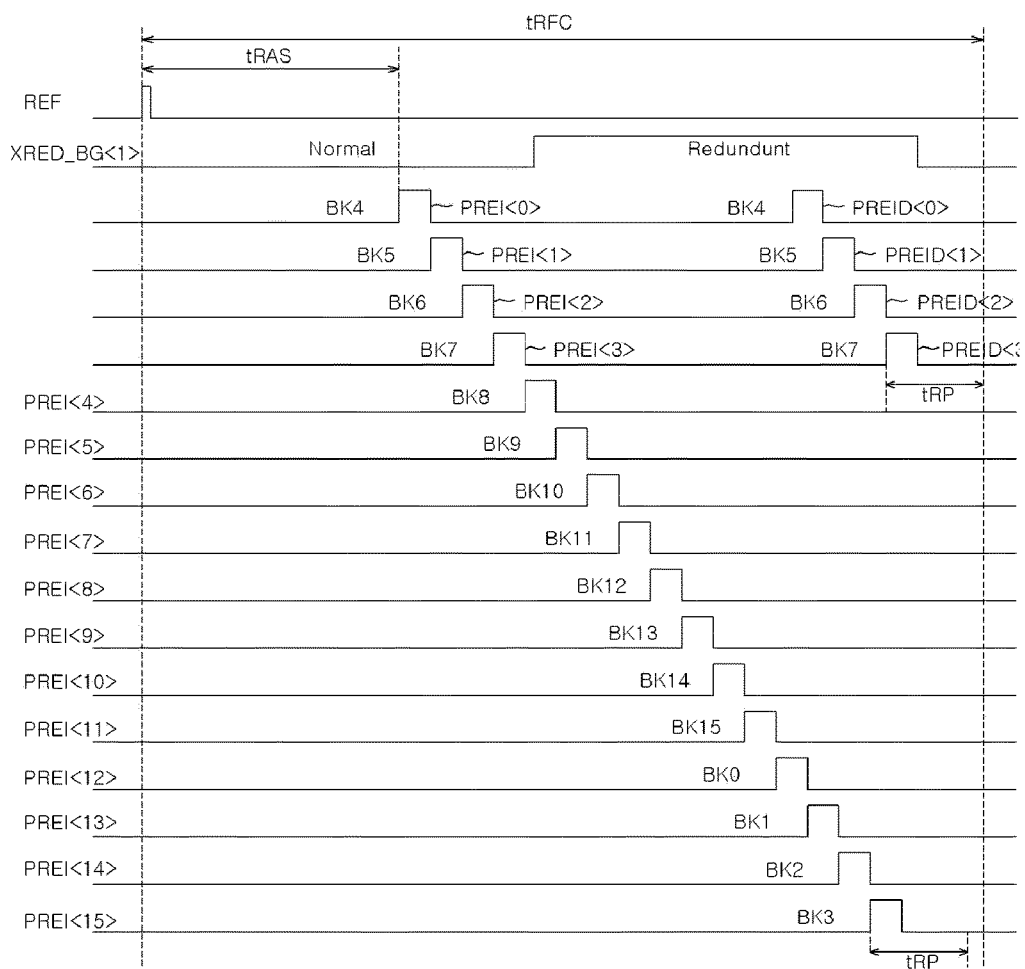

As illustrated in FIG. 4B, after the delay time corresponding to tRAS passes from the activation timing of the respective pre-control signals FACTI<0:15>, the pre-control signals PREI<0:15> are sequentially activated with the interval of the piled delay.

After the delay time corresponding to tRAS passes from the activation timing of the respective additional pre-control signals FACTID<0:3>, the additional pre-control signals PREID<0:3> are sequentially activated with the interval of the piled delay.

The control signals FACTD<0:15> and PRED<0:15> are generated by the pre-control signals FACTI<0:15> and PREI<0:15> and the additional pre-control signals FACTID<0:3> and PREID<0:3> which are generated in FIGS. 4A and 4B.

According to the control signals FACTD<0:15> and PRED<0:15>, the row active signals RACT<0:15> are generated.

As the refresh command REF is inputted again, the value of the bank count signals BKCNT<0:1> is increased.

As the value of the bank count signals BKCNT<0:1> is increased, by the operation of the switching block 400 shown in FIGS. 2A and 2B, the pre-control signals FACTI<0:15> and PREI<0:15> and the additional pre-control signals FACTID<0:3> and PREID<0:3> are matched with the control signals FACTD<0:15> and PRED<0:15> which are differently ordered.

Accordingly, by the pre-control signals FACTI<0:15> and PREI<0:15> and the additional pre-control signals FACTID<0:3> and PREID<0:3>, the memory banks BK0 to BK15 are refresh-designated in the order of the memory banks BK4, BK5, . . . , BK0, BK1, BK2 and BK3.

While the additional refresh flag XRED_BG<1> among the additional refresh flags XRED_BG<0:3> remains in a deactivated state (a logic low) by the bank count signals BKCNT<0:1> the value of which is increased, the additional refresh flag XRED_BG<1> is activated by the additional pre-control signal FACTID<0> and is deactivated by the additional pre-control signal PREID<3>.

The remaining additional refresh flags XRED_BG<0,2: 3> remain in a deactivated state.

While the additional refresh flag XRED_BG<1> remains in the deactivated state (the logic low), the memory region 600 performs the normal piled refresh operation by activating normal word lines of the plurality of memory banks BK0 to BK15 in the order of the memory banks BK4, BK5, . . . , BK2 and BK3 according to the row active signals RACT<0:15> and the row address signals RA<0:12>.

While the additional refresh flag XRED_BG<1> remains in an activated state (a logic high), the memory region 600 may determine that a redundant piled refresh operation for the memory banks BK4 to BK7 corresponding to the additional refresh flag XRED_BG<1> among the plurality of memory banks BK0 to BK15 is designated.

While remaining in the normal piled refresh operation for the memory banks BK4, BK5, BK6, . . . and BK3, the memory region 600 performs the redundant piled refresh operation by activating redundant word lines of the memory banks BK4 to BK7 corresponding to the additional refresh flag XRED_BG<1> in the order of the memory banks BK4, BK5, BK6 and BK7.

Figure 5:
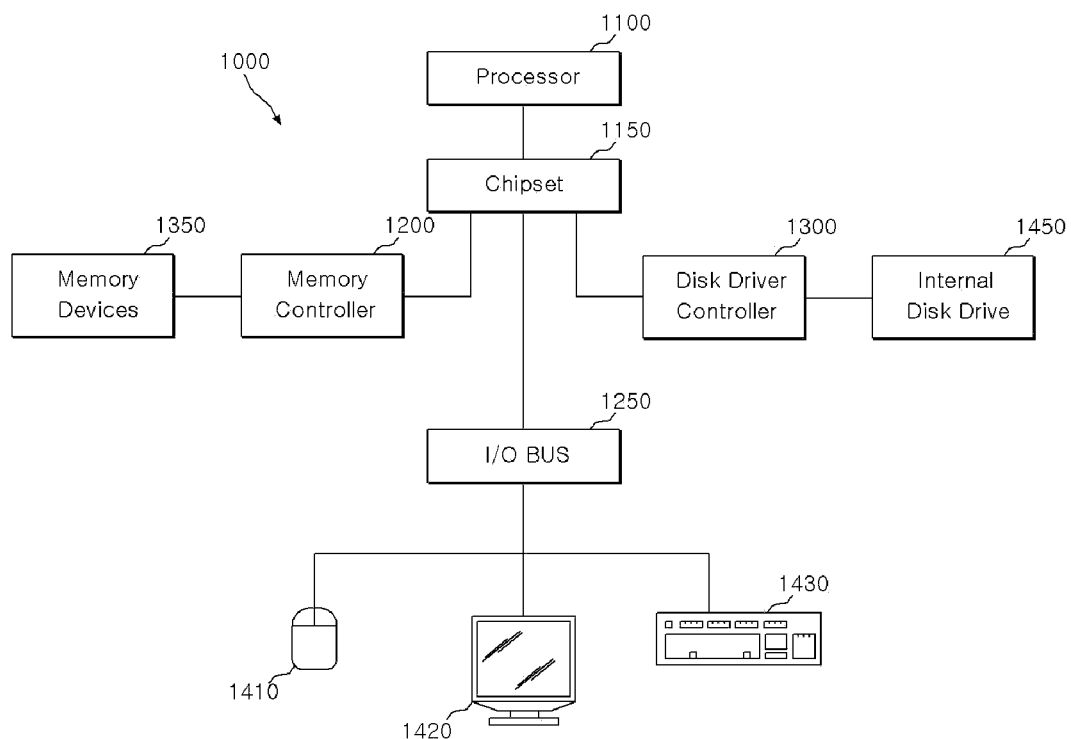
FIG. 5 illustrates a block diagram of an example of a representation of a system employing the refresh circuits in accordance with the embodiments discussed above with relation to FIGS. 1-4B.

The refresh circuits discussed above (see FIGS. 1-4B) are particular useful in the design of memory devices, processors, and computer systems. For example, referring to FIG. 5, a block diagram of a system employing the refresh circuits in accordance with the embodiments are illustrated and generally designated by a reference numeral 1000. The system 1000 may include one or more processors or central processing units ("CPUs") 1100. The CPU 1100 may be used individually or in combination with other CPUs. While the CPU 1100 will be referred to primarily in the singular, it will be understood by those skilled in the art that a system with any number of physical or logical CPUs may be implemented.

A chipset 1150 may be operably coupled to the CPU 1100. The chipset 1150 is a communication pathway for signals between the CPU 1100 and other components of the system 1000, which may include a memory controller 1200, an input/output ("I/O") bus 1250, and a disk drive controller 1300. Depending on the configuration of the system, any one of a number of different signals may be transmitted through the chipset 1150, and those skilled in the art will appreciate that the routing of the signals throughout the system 1000 can be readily adjusted without changing the underlying nature of the system.

As stated above, the memory controller 1200 may be operably coupled to the chipset 1150. The memory controller 1200 may include at least one refresh circuit as discussed above with reference to FIGS. 1-4B. Thus, the memory controller 1200 can receive a request provided from the CPU 1100, through the chipset 1150. In alternate embodiments, the memory controller 1200 may be integrated into the chipset 1150. The memory controller 1200 may be operably coupled to one or more memory devices 1350. In an embodiment, the memory devices 1350 may include the at least one refresh circuit as discussed above with relation to FIGS. 1-4B, the memory devices 1350 may include a plurality of word lines and a plurality of bit lines for defining a plurality of memory cell. The memory devices 1350 may be any one of a number of industry standard memory types, including but not limited to, single inline memory modules ("SIMMs") and dual inline memory modules ("DIMMs"). Further, the memory devices 1350 may facilitate the safe removal of the external data storage devices by storing both instructions and data.

The chipset 1150 may also be coupled to the I/O bus 1250. The I/O bus 1250 may serve as a communication pathway for signals from the chipset 1150 to I/O devices 1410, 1420 and 1430. The I/O devices 1410, 1420 and 1430 may include a mouse 1410, a video display 1420, or a keyboard 1430. The I/O bus 1250 may employ any one of a number of communications protocols to communicate with the I/O devices 1410, 1420, and 1430. Further, the I/O bus 1250 may be integrated into the chipset 1150.

The disk drive controller 1450 (i.e., internal disk drive) may also be operably coupled to the chipset 1150. The disk drive controller 1450 may serve as the communication pathway between the chipset 1150 and one or more internal disk drives 1450. The internal disk drive 1450 may facilitate disconnection of the external data storage devices by storing both instructions and data. The disk drive controller 1300 and the internal disk drives 1450 may communicate with each other or with the chipset 1150 using virtually any type of communication protocol, including all of those mentioned above with regard to the I/O bus 1250.

It is important to note that the system 1000 described above in relation to FIG. 5 is merely one example of a system employing the refresh circuit as discussed above with relation to FIGS. 1-4B. In alternate embodiments, such as cellular phones or digital cameras, the components may differ from the embodiments illustrated in FIG. 5.

While various embodiments have been described above, it will be understood to those skilled in the art that the embodiments described are by way of example only. Accordingly, the refresh circuit described herein should not be limited based on the described embodiments.

What is claimed is:

1. A refresh circuit configured to perform a first refresh operation for normal regions of a plurality of memory banks within a first time period, and configured to perform a second refresh operation for redundant regions of a partial number of memory banks among the plurality of memory banks,
    wherein the first time period is determined according to a first parameter,
    wherein the second refresh operation is performed for the partial number of memory banks that have completed the first refresh operation, and
    wherein the second refresh operation is performed within the first time period.

2. The refresh circuit according to claim 1, wherein the first refresh operation comprises a piled refresh operation.

3. The refresh circuit according to claim 1, wherein the second refresh operation comprises a piled refresh operation.

4. The refresh circuit according to claim 1, wherein the second refresh operation is performed for memory banks for which a marginal time period after the first refresh operation has completed, when compared to the first time period, is equal to or longer than a second parameter.

5. The refresh circuit according to claim 1, wherein the first refresh operation is performed in response to a refresh command.

6. A refresh circuit configured to perform, while performing a normal refresh operation for normal regions of a plurality of memory banks within a first time period determined according to a first parameter in response to an initial refresh command, a redundant refresh operation a for redundant regions of a first memory bank group for which the first refresh operation has completed, within the first time period,
    and perform, while performing another normal refresh operation for the plurality of memory banks, starting from a memory bank ordered next to the first memory bank group, within the first time in response to a refresh command after the initial refresh command, another redundant refresh operation for a second memory bank group for which the first refresh operation has completed, within the first time period.

7. The refresh circuit according to claim 6, wherein the normal refresh operation comprises a piled refresh operation.

8. The refresh circuit according to claim 6, wherein the redundant refresh operation comprises a piled refresh operation.

9. The refresh circuit according to claim 6, wherein the redundant refresh operation is performed for memory banks for which a marginal time period after the normal refresh operation has completed, when compared to the first time period, is equal to or longer than a second parameter.

10. A refresh circuit comprising:
    a memory region configured to perform a first refresh operation for a plurality of memory banks and a second refresh operation for a partial number of memory banks among the plurality of memory banks, in response to row active signals and additional refresh flags;
    a control block configured to generate pre-control signals and the additional refresh flags for controlling the first refresh operation and the second refresh operation, in response to a refresh command;
    a counting block configured to generate bank count signals in response to the refresh command;
    a switching block configured to generate control signals for changing an order of memory banks designated by the pre-control signals among the plurality of memory banks, in response to the bank count signals; and
    an active signal generation block configured to generate the row active signals,
    wherein the row active signals define active periods of memory banks corresponding to the control signals among the plurality of memory banks.

11. The refresh circuit according to claim 10, wherein the first refresh operation and the second refresh operation are respective refresh operations for normal regions and redundant regions of memory banks selected among the plurality of memory banks.

12. The refresh circuit according to claim 10, wherein the additional refresh flags are configured to designate the second refresh operation for respective memory bank groups,
    wherein the respective memory bank groups are predefined by dividing the plurality of memory banks.

13. The refresh circuit according to claim 10, wherein the control block comprises:
    a first controller configured to generate the pre-control signals in response to the refresh command;
    a delay configured to delay the refresh command, and output a delayed refresh command;
    a second controller configured to generate additional pre-control signals in response to the delayed refresh command; and
    an additional refresh flag generator configured to generate the additional refresh flags in response to the bank count signals and a part of the additional pre-control signals.

14. The refresh circuit according to claim 13, wherein the first controller is configured to deactivate partial signal bits among the pre-control signals, in response to the delayed refresh command.

15. The refresh circuit according to claim 13, wherein the delay is designed to have a delay time corresponding to a parameter tRC.

16. The refresh circuit according to claim 13, wherein the second controller is configured to deactivate the additional pre-control signals in response to the refresh command.

17. The refresh circuit according to claim 13, wherein signal lines for transmitting the additional pre-control signals are respectively shorted with signal lines for transmitting the pre-control signals.

18. The refresh circuit according to claim 13, wherein the switching block comprises a plurality of switching units configured to change an activation order of the plurality of memory banks by matching the pre-control signals to control signals of which order is sequentially changed, in response to the bank count signals.

\* \* \* \* \*